(12) United States Patent
Lee et al.

(10) Patent No.: US 7,554,426 B2
(45) Date of Patent: Jun. 30, 2009

(54) RESONATOR, APPARATUS HAVING THE SAME AND FABRICATION METHOD OF RESONATOR

(75) Inventors: Joo-ho Lee, Yongin-si (KR); Hae-seok Park, Yongin-si (KR); Myeong-kwon Gu, Yongin-si (KR); Jae-shik Shin, Yongin-si (KR); In-sang Song, Yongin-si (KR); Kwang-jae Shin, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 11/701,456

(22) Filed: Feb. 2, 2007

(65) Prior Publication Data

US 2008/0061907 A1   Mar. 13, 2008

(30) Foreign Application Priority Data

Sep. 12, 2006   (KR)   .................. 10-2006-0088285

(51) Int. Cl.
  H03H 9/13   (2006.01)
  H03H 9/15   (2006.01)
  H03H 3/02   (2006.01)
  H03H 9/54   (2006.01)

(52) U.S. Cl. .................... 333/187; 333/188; 333/189; 310/364

(58) Field of Classification Search ................ 333/187, 333/189, 188; 310/363, 364
See application file for complete search history.

(56) References Cited

U.S. PATENT DOCUMENTS

| | | | | |
|---|---|---|---|---|
| 6,291,931 | B1 | 9/2001 | Lakin | |
| 6,407,649 | B1 * | 6/2002 | Tikka et al. | 333/133 |
| 6,462,631 | B2 * | 10/2002 | Bradley et al. | 333/189 |
| 6,936,837 | B2 * | 8/2005 | Yamada et al. | 257/2 |
| 7,180,390 | B2 * | 2/2007 | Umeda et al. | 333/187 |
| 2002/0153965 | A1 * | 10/2002 | Ruby et al. | 333/133 |
| 2004/0046622 | A1 * | 3/2004 | Aigner et al. | 333/187 |
| 2004/0140868 | A1 | 7/2004 | Takeuchi et al. | |
| 2006/0131990 | A1 * | 6/2006 | Milsom et al. | 310/311 |

FOREIGN PATENT DOCUMENTS

| | | |
|---|---|---|
| EP | 1 124 328 A1 | 8/2001 |
| EP | 1 253 713 A3 | 10/2002 |
| JP | 2001-156582 A | 6/2001 |
| JP | 2005-244486 A | 9/2005 |
| JP | 2005-286945 A | 10/2005 |

OTHER PUBLICATIONS

Satoh, Y., et al., "Development of Piezoelectric Thin Film Resonator and Its Impact on Future Wireless Communication Systems.", Japanese Journal of Applied Physics, May 2005, p. 2883-2894, vol. 44 No. 5A, The Japan Society of Applied Physics.

Lee, S., et al., "Growth of highly c-axis textured AlN films on Mo electrodes for film bulk acoustic wave resonators.", Journal of Vacuum Science and Technology, American Institute of Physics, Jan. 2003, p. 1-5, vol. 21, No. 1, American Vacuum Society.

* cited by examiner

Primary Examiner—Barbara Summons
(74) Attorney, Agent, or Firm—Sughrue Mion, PLLC

(57) ABSTRACT

A resonator includes a substrate, and a resonating unit formed on the substrate, and having a lower electrode, a piezoelectric film, and an upper electrode. The lower electrode is formed of at least two layers to adjust a piezoelectric coupling coefficient. The lower electrode includes a first electrode layer and a second electrode layer, which have crystallographic characteristics, particularly, grain sizes or surface roughnesses Ra, different from each other, respectively. The first and the second electrode layers are formed to have a predetermined thickness ratio to each other.

18 Claims, 7 Drawing Sheets

RESONATOR, APPARATUS HAVING THE SAME AND FABRICATION METHOD OF RESONATOR

This application claims priority under 35 U.S.C. § 119 (a) from Korean Patent Application No. 10-2006-0088285 filed on Sep. 12, 2006 in the Korean Intellectual Property Office, the disclosure of which is incorporated herein by reference in its entirety.

BACKGROUND OF THE INVENTION

1. Field of the Invention

The present invention relates to a resonator, which filters an oscillation or wave of a predetermined frequency using a resonance phenomenon, an apparatus having the same and a fabrication method of the resonator.

2. Description of the Related Art

With the recent rapid development of mobile communication apparatuses, chemical and bio apparatuses, etc., a demand for a small, lightweight filter, an oscillator, a resonant element, an acoustic resonant mass sensor, a duplexer, etc., which are used in such apparatuses, is increasing.

As means for realizing the small, lightweight filter, the oscillator, the resonant element, the acoustic resonant mass sensor, the duplexer, etc., a film bulk acoustic resonator (FBAR) is known.

In general, the FBAR is configured in a structure including a resonating unit in which a lower electrode, a piezoelectric film, and an upper electrode are layered in turn on a substrate.

The FBAR constructed as above forms a part for electronic circuit, such as a filter, an oscillator, a resonant element, an acoustic resonant mass sensor, a duplexer, etc., out of a single FBAR or a plurality of FBARs combined with each other.

For example, if a plurality of FBARs are properly combined in series and in shunt, a band-pass filter with a predetermined central frequency and a predetermined frequency band width can be embodied. Also, if the band-pass filter is combined with a phase shifter made up of an inductor and a capacitor, a duplexer can be embodied.

In such a duplexer, a filtering performance is influenced by a roll-off characteristic of the band-pass filter.

For instance, in case of a US personal communication system (US-PCS) duplexer, as illustrated in a dotted line of FIG. 1, a roll-off of a transmitter filter Tx and a receiver filter Rx is located in a band of 1915~1925 MHz (10 MHz) that a band of ±3 MHz (6 MHz) under the influence caused by a temperature coefficient TC effect and a process margin band of ±2 MHz (4 MHz) taking account of thickness uniformity are subtracted from a transmitter filter-receiver filter guard-band of 1910~1930 MHz (20 MHz). Such a roll-off is located in a very narrow band, as illustrated in a waveform diagram of FIG. 2, which explains an effective frequency of the transmitter filter Tx under the influence caused by the temperature coefficient TC effect.

Accordingly, in an operation of a FBAR forming a filter, to prevent a resonance frequency of the FBAR from interfering with the effective frequency of the filter, it is important that the FBAR should be fabricated so as to get a value of an effective piezoelectric coupling coefficient $Kt2\_eff$ thereof to satisfy a roll-off of the filter. Here, the effective piezoelectric coupling coefficient $Kt2\_eff$ of the FBAR, which shows a ratio of electric energy to acoustic energy in the operation of the FBAR, can be represented as a width between a peak point of a resonance frequency and a peak point of an antiresonance frequency, as illustrated in FIG. 3.

Thus, there is needed a new FBAR capable of freely adjusting the effective piezoelectric coupling coefficient $Kt2\_eff$ of the FBAR so as to satisfy the roll-off of the filter.

SUMMARY OF THE INVENTION

Exemplary embodiments of the present invention are to address at least the above problem and/or disadvantage and to provide at least the advantages described below. Accordingly, an aspect of the present invention is to provide a resonator in which a lower electrode is formed of two electrode layers having different grain sizes and/or a predetermined thickness ratio to each other, so that a value of a piezoelectric coupling coefficient $Kt2\_eff$ of the resonator can be freely adjusted without requiring a separate process or design, thereby allowing a degree of freedom in design and a characteristic of a filter to improve, an apparatus having the same and a fabrication method of the resonator.

Additional aspects and advantages of the invention will be set forth in part in the description which follows and, in part, will be obvious from the description, or may be learned by practice of the invention.

According to an aspect of the present invention, there is provided a resonator including a substrate, and a resonating unit formed on the substrate, and having a lower electrode, a piezoelectric film, and an upper electrode, wherein the lower electrode is formed of at least two layers to adjust a piezoelectric coupling coefficient.

The lower electrode may include a first electrode layer and a second electrode layer, which have crystallographic characteristics different from each other, respectively. Particularly, the first and the second electrode layers may be formed to have grain sizes or surface roughnesses Ra different from each other, respectively. In this case, preferably, but not necessarily, the second electrode layer is formed over the first electrode layer, so that the grain size or the surface roughness Ra thereof is larger than that of the first electrode layer.

Further, the first and the second electrode layers may be formed to have a predetermined thickness ratio to each other.

Also, the first and the second electrode layers may be formed of the same material. In this case, preferably, but not necessarily, the first and the second electrode layers may be formed of one selected out of Au, Ti, Ta, Mo, Ru, Pt, W, Al, and Ni.

According to another aspect of the present invention, there is provided a fabrication method of a resonator including: forming a lower electrode on a substrate, the lower electrode comprising a first electrode layer and a second electrode layer, which have crystallographic characteristics different from each other, respectively, and forming a piezoelectric film and an upper electrode in turn on the lower electrode to form a resonating unit.

The first and the second electrode layers may be formed to have grain sizes or surface roughnesses Ra different from each other, respectively. In this case, preferably, but not necessarily, the second electrode layer is formed over the first electrode layer, so that the grain size or the surface roughness Ra thereof is larger than that of the first electrode layer.

Further, the first and the second electrode layers may be formed to have a predetermined thickness ratio to each other.

Also, the first and the second electrode layers may be formed of the same material. In this case, preferably, but not necessarily, the first and the second electrode layers are formed of one selected out of Au, Ti, Ta, Mo, Ru, Pt, W, Al, and Ni.

According to still another aspect of the present invention, there is provided an apparatus including a substrate, a first resonator formed on the substrate, and having a first lower electrode, a first piezoelectric film, and a first upper electrode, the first lower electrode being formed of at least two layers to adjust a piezoelectric coupling coefficient, a second resonator formed on the substrate, and having a second lower electrode, a second piezoelectric film, and a second upper electrode, the second lower electrode being formed of at least two layers to adjust a piezoelectric coupling coefficient, and a frequency tuning layer formed on one of the first and the second resonators, so that the one of the first and the second resonators has a resonance frequency lower than that of the other.

The frequency tuning layer may be formed on one of the first and the second upper electrodes.

BRIEF DESCRIPTION OF THE DRAWINGS

The above aspects and features of the present invention will be more apparent from the description of exemplary embodiments of the present invention taken with reference to the accompanying drawings, in which.

Throughout the drawings, the same drawing reference numerals will be understood to refer to the same elements, features, and structures.

DETAILED DESCRIPTION OF EXEMPLARY EMBODIMENTS OF THE INVENTION

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
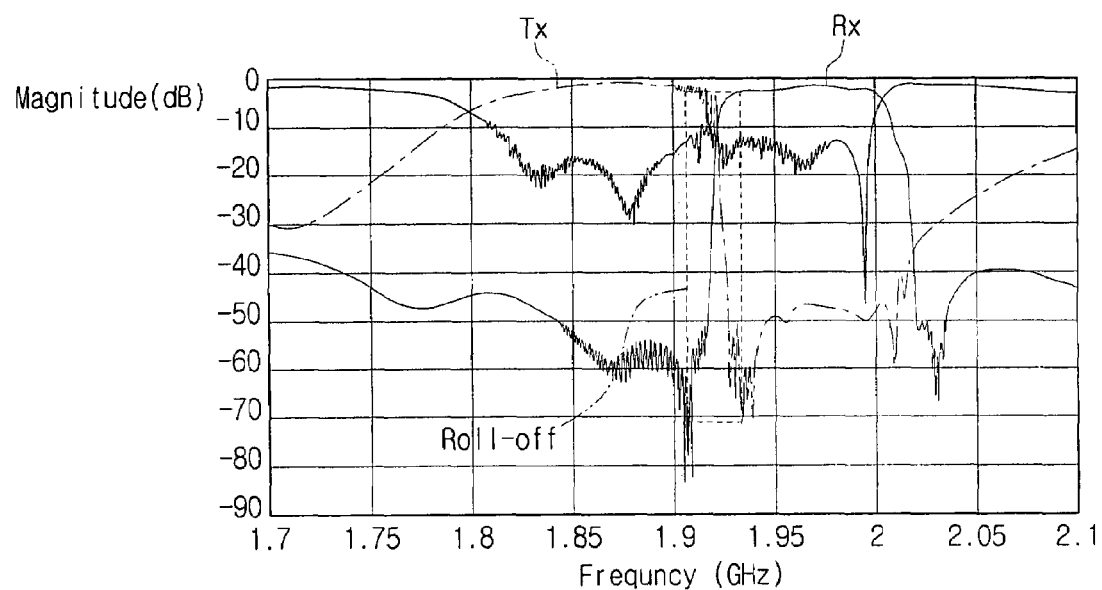
FIG. 1 is a waveform diagram exemplifying a roll-off characteristic of a transmitter filter Tx and a receiver filter Rx in a general US personal communication system (US-PCS) duplexer using a film bulk acoustic resonator (FBAR)
Figure 2:
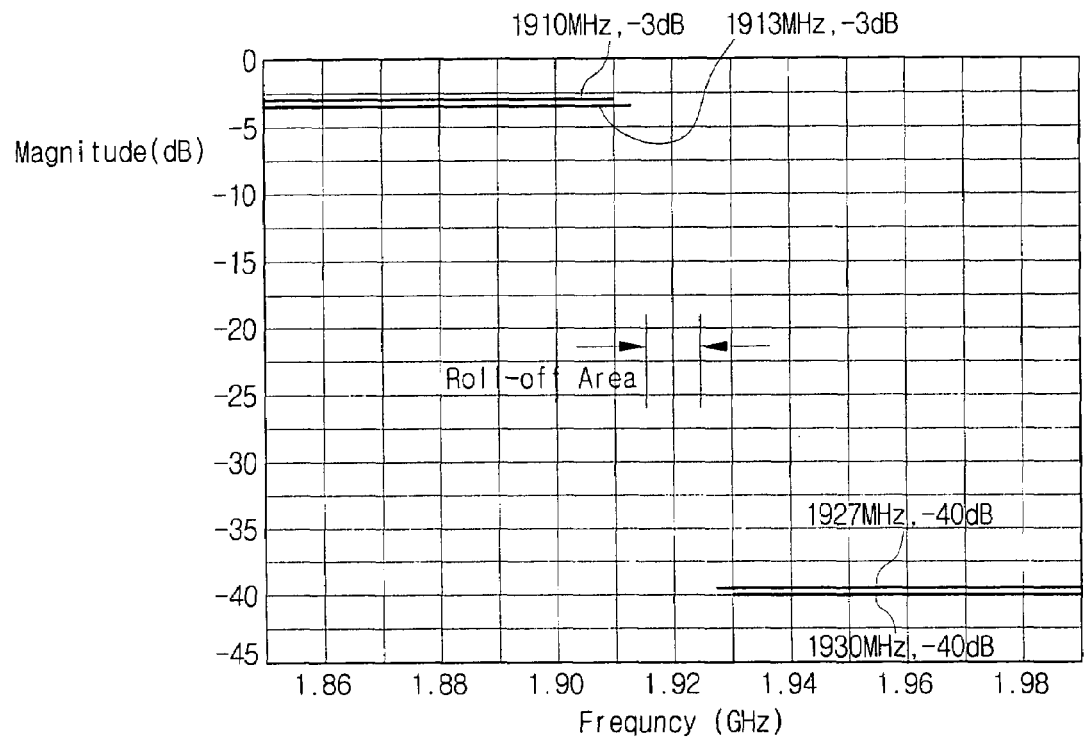
FIG. 2 is a waveform diagram illustrating an influence of a temperature coefficient effect to an effective frequency of the transmitter filter Tx of FIG. 1.
Figure 3:
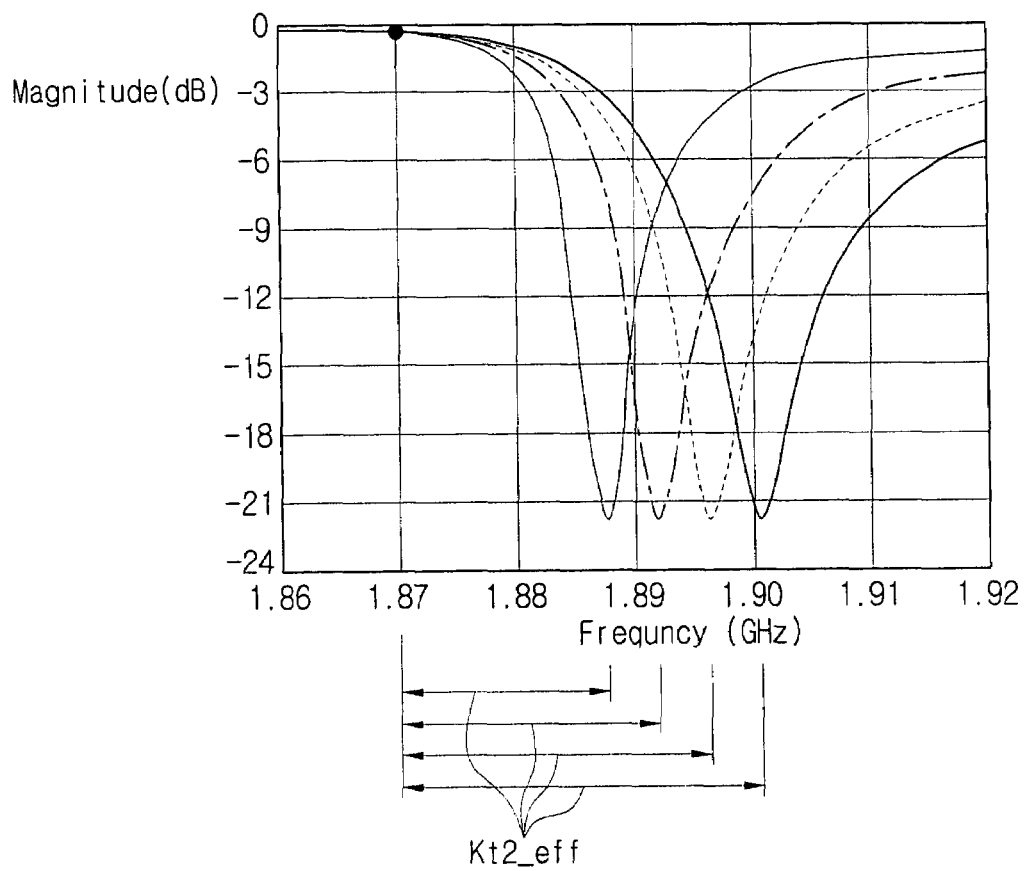
FIG. 3 is a waveform diagram illustrating a frequency according to an effective piezoelectric coupling coefficient Kt2_eff in a general FBAR.
Figure 4:
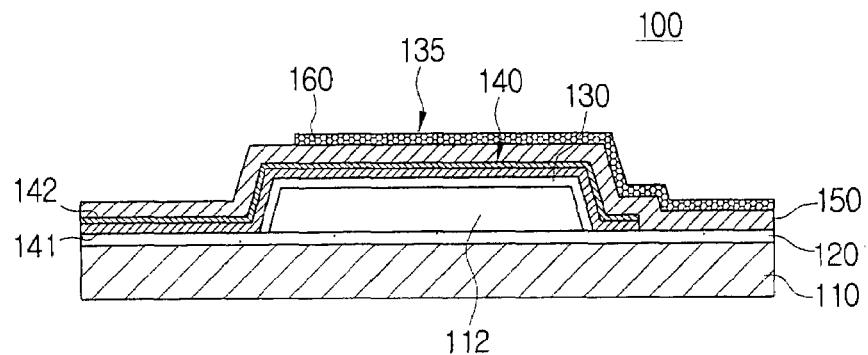
FIG. 4 is a cross sectional view illustrating a FBAR as a resonator in accordance with an exemplary embodiment of the present invention.

FIG. 4 is a cross sectional view illustrating a film bulk acoustic resonator (referred as FBAR below) as a resonator in accordance with an exemplary embodiment of the present invention.

Referring to FIG. 4, the FBAR 100 according to the exemplary embodiment of the present invention includes a substrate 110, an insulating layer 120, an air cavity 112, and a resonating unit 135.

The substrate 110 is made of a general silicon substrate.

On the substrate 110 is layered the insulating layer 120, which electrically isolates the resonating unit 135 from the substrate 110. The insulating layer 120 is formed depositing $SiO_2$ or $Al_2O_3$ by a chemical vapor deposition method, a RF magnetron sputtering method, or an evaporation method.

On the insulating layer 120 is disposed the air cavity 112. The air cavity 112 is located under the resonating unit 135, so that the resonating unit 135 can be oscillated in a predetermined direction. The air cavity 112 is formed by a series of processes, which forms an air cavity sacrificing layer pattern 111 (see FIG. 5B) on the insulating layer 120, forms a membrane 130 on the air cavity sacrificing layer pattern 111, and then etches and removes the air cavity sacrificing layer pattern 111, as described below.

The resonating unit 135 includes a lower electrode 140, a piezoelectric film 150 and an upper electrode 160, which are layered and located in turn over the air cavity 112.

The lower electrode 140 is disposed on the membrane 130 forming the air cavity 112.

The lower electrode 140 is made up of a first electrode layer 141 and a second electrode layer 142.

The first and the second electrode layers 141 and 142 are formed of the same metal, so that they can be fabricated by the same process and the same equipment. To be more specific, preferably, but not necessarily, the first and the second electrode layers 141 and 142 is formed of a material with a superior conductivity, for example, Au, Ti, Ta, Mo, Ru, Pt, W, Al, or Ni.

Also, the first and the second electrode layers 141 and 142 are formed to have grain sizes different from each other, respectively, and/or a predetermined thickness ratio to each other. The reason is that if the first and the second electrode layers 141 and 142 are formed properly adjusting the grain sizes and/or the thickness ratio, an effective piezoelectric coupling coefficient Kt2_eff of the finally formed FBAR 100 can be easily adjusted in an individual value, which requires in each of parts for electronic circuit, such as a duplexer, a filter, etc., over a wide range.

To be more specific, to adjust a value of the effective piezoelectric coupling coefficient Kt2_eff, it has been attempted to change a crystallographic condition of the piezoelectric film and geometrical conditions, such as thicknesses and positions, of various layers forming the FBAR, but not to change a crystallographic condition and a geometrical condition of the lower electrode 140 as yet. Accordingly, to adjust the value of the effective piezoelectric coupling coefficient Kt2_eff, the present invention changes the crystallographic condition and the geometrical condition of the lower electrode 140, thereby allowing the crystallographic condition of the piezoelectric film and the geometrical condition of the FBAR 100 to be changed. For this, the lower electrode 140 is made up of a plurality of layers. That is, the first and the second layers 141 and 142 having the grain sizes different from each other and/or the thicknesses formed in the predetermined ratio to each other, respectively. As a result, the effective piezoelectric coupling coefficient Kt2_eff of the FBAR 100 can be easily adjusted in a diverse range of values, which is required in the parts for an electronic circuit, such as the duplexer, the band pass filter, etc.

Figure 6:
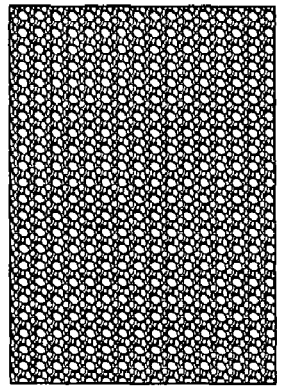
FIG. 6 is a view illustrating surfaces of piezoelectric films and cross sections of lower electrodes and piezoelectric films in exemplary embodiments of the FBAR fabricated according to the fabrication method of the present invention and a comparative example of the FBAR fabricated according to the conventional fabrication method.
Figure 6:
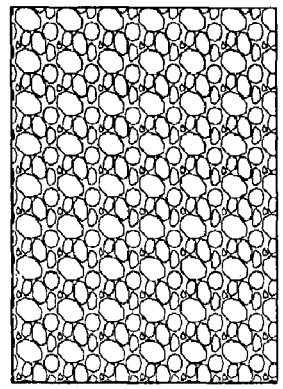
Figure 6:
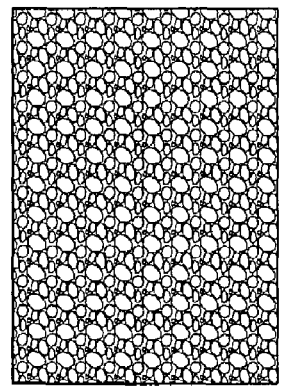
Figure 6:
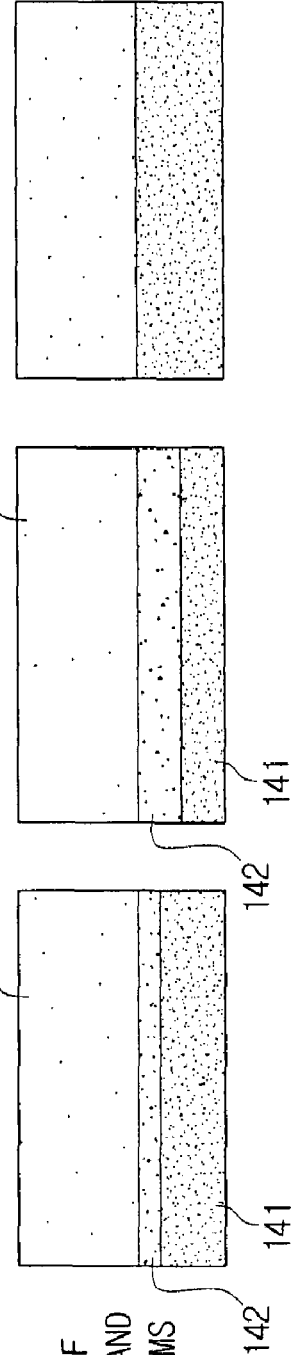

According to an experiment in the case of a first example of the FBAR of the present invention illustrated in FIG. 6 and table 1 below, when the lower electrode 140 was formed of a first and a second electrode layers 141 and 142, which are made of Mo and which have surface roughnesses Ra of approximately 8.55 Å and 13.64 Å (grain sizes measured as surface roughnesses Ra in the experiment) and thicknesses of approximately 3,000 Å and approximately 1,000 Å, respectively. The piezoelectric film 150 was formed of AlN, a value of a full width at half maximum (FWHM) of the piezoelectric film 150 was approximately 2.1, and a value of the effective piezoelectric coupling coefficient Kt2_eff of the FBAR 100 was approximately 4.0%, which is required in a part for electronic circuit, for example, a US PCS duplexer (see FIG. 7). To the contrary, as in case of a comparative example of the conventional FBAR illustrated in FIG. 6 and table 1 below, when the lower electrode was formed of a single metal layer, which is made of Mo and which has a surface roughness Ra of approximately 8.55 Å and a thickness of approximately 4,000 Å and the piezoelectric film was formed of AlN, a value of the FWHM of the piezoelectric film was approximately 1.7 and a value of the effective piezoelectric coupling coefficient Kt2_eff of the FBAR was approximately 5.6%, which is relatively high.

Figure 7:
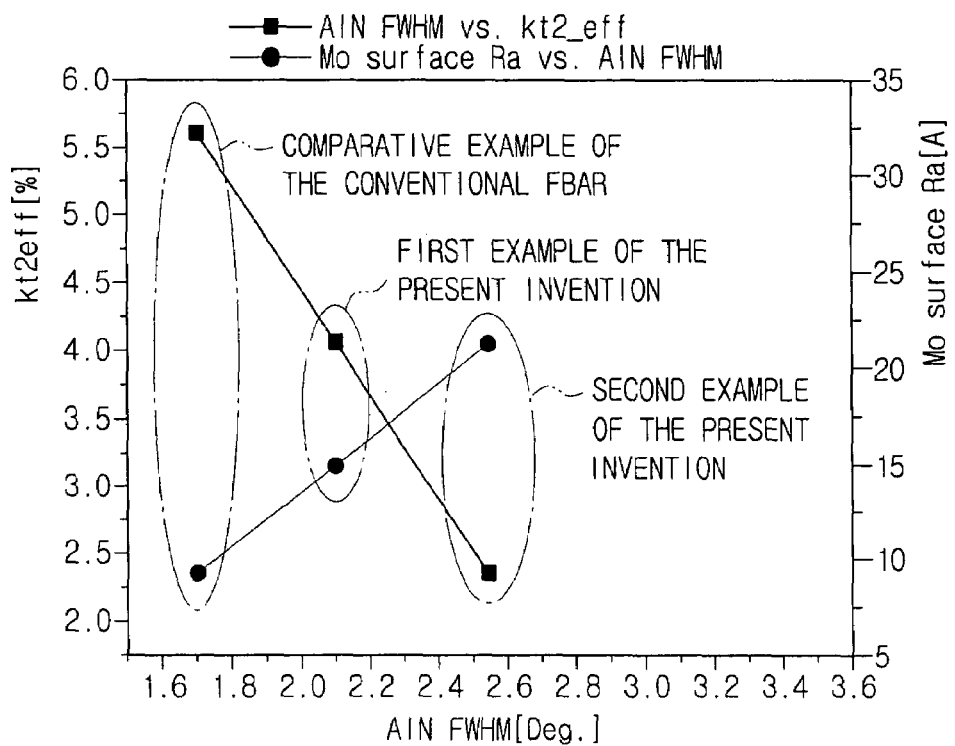
FIG. 7 is a graph illustrating a correlation among full width at half maximums (FWHM) and effective piezoelectric coupling coefficients Kt2_eff of the piezoelectric films and surface roughnesses of second electrode layers in the exemplary embodiments of the present invention and the comparative example of the FBAR fabricated according to the conventional fabrication method, which are illustrated in FIG. 6.

Further, according to the experiment, as illustrated in table 1 above and FIG. 7, it was proved that the FWHM of the piezoelectric film 150 is in inverse proportion to the effective piezoelectric coupling coefficient Kt2_eff of the FBAR 100 and is in proportion to the surface roughness Ra of the second electrode layer 142. For instance, when the first and the second electrode layers 141 and 142 were formed in the surface roughnesses Ra of approximately 8.55 Å and 13.64 Å, respectively, the value of the FWHM of the piezoelectric film 150 was approximately 2.1, and the value of the effective piezoelectric coupling coefficient Kt2_eff of the FBAR 100 was approximately 4.0% (the first example of the present invention), whereas when the first and the second electrode layers 141 and 142 were formed in surface roughnesses Ra of approximately 8.55 Å and 21.53 Å, respectively, a value of the FWHM of the piezoelectric film 150 was approximately 2.54, and a value of the effective piezoelectric coupling coefficient Kt2_eff of the FBAR 100 was approximately 2.13% (a second example of the present invention).

Accordingly, it can be appreciated that when the lower electrode 140 was formed of the first and the second electrode layers 141 and 142 and the surface roughness Ra of the second electrode layer 142 was properly adjusted, so that it differed from, particularly larger than, that of the first electrode layer 141, the effective piezoelectric coupling coefficient Kt2_eff of the FBAR 100 can be easily adjusted over a wide range.

Figure 8:
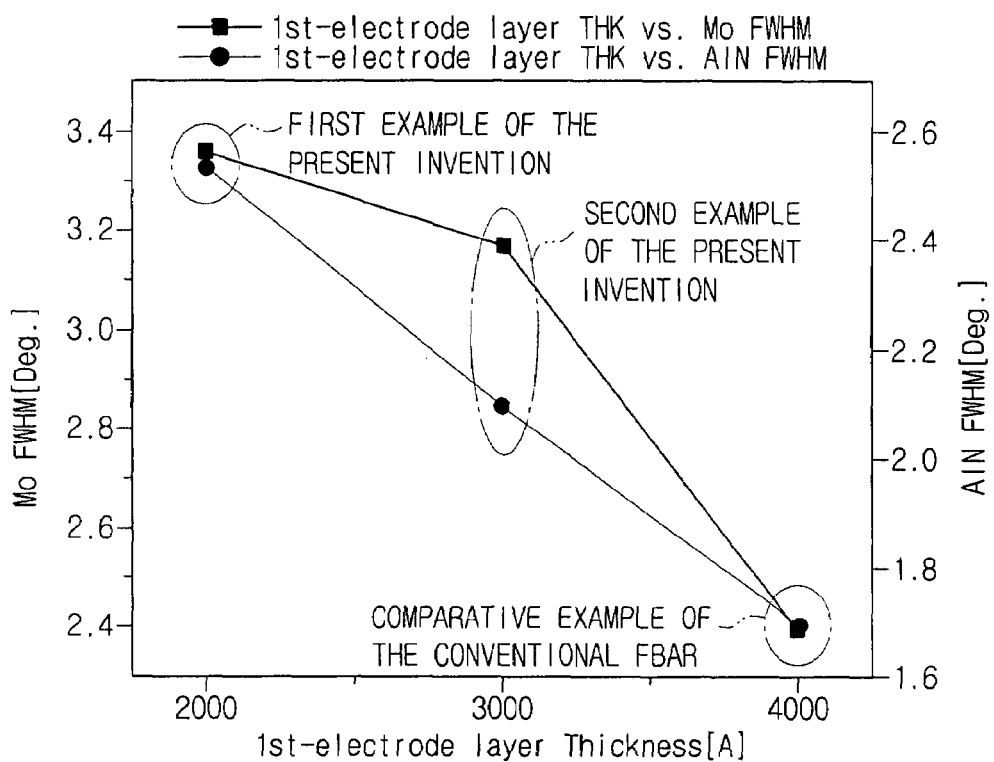
FIG. 8 is a graph illustrating a correlation among thicknesses of first electrode layers and FWHMs of lower electrodes and the piezoelectric films in the exemplary embodiments of the present invention and the comparative example of the FBAR fabricated according to the conventional fabrication method, which are illustrated in FIG. 6.

Also, according to the above experiment, as illustrated in table 1 above and FIG. 8, it was proved that the thickness of the first electrode layer 141 is in inverse proportion to the FWHMs of the lower electrode 140 and the piezoelectric film 150 and the thickness of the second electrode layer 142 is in proportion to the FWHMs of the lower electrode 140 and the piezoelectric film 150. Accordingly, as illustrated in FIG. 7, since the FWHM of the piezoelectric film 150 is in inverse proportion to the effective coupling coefficient Kt2_eff of the FBAR 100, the thickness of the first electrode layer 141 is in proportion to the effective coupling coefficient Kt2_eff and the thickness of the second electrode layer 142 is inverse proportion to the effective coupling coefficient Kt2_eff. For instance, when the first and the second electrode layers 141 and 142 were formed in the thicknesses of approximately 3,000 Å and 1,000 Å, respectively, values of the FWHMs of the lower electrode 140 and the piezoelectric film 150 were approximately 3.17 and 2.1, respectively, and a value of the effective coupling coefficient Kt2_eff was approximately 4.0% (the first example of the present invention), whereas

TABLE 1

|  | First example of the present invention | | | Second example of the present invention | | | Comparative example of the conventional FBAR | |
| --- | --- | --- | --- | --- | --- | --- | --- | --- |
|  | Lower electrode | | | Lower electrode | | | | |
|  | First electrode layer | Second electrode layer | Piezoelectric film | First electrode layer | Second electrode layer | Piezoelectric film | Lower electrode | Piezoelectric film |
| Material | Mo | Mo | AlN | Mo | Mo | AlN | Mo | AlN |
| Thickness(Å) | 3,000 | 1,000 | — | 2,000 | 2,000 | — | 4,000 | — |
| Stress(Mpa) | −431.9 | −203.9 | 184.2 | −431.9 | −50.9 | 273.4 | −431.9 | 84.7 |
| Surface roughness(Ra) | 8.55 | 13.64 | 13.44 | 8.55 | 21.53 | 18.88 | 8.55 | 11.22 |
| FWHM(degree) | 3.17 | | 2.1 | 3.36 | | 2.54 | 2.4 | 1.7 | when the first and the second electrode layers 141 and 142 were formed in the thicknesses of approximately 2,000 Å and 2,000 Å, respectively, values of the FWHMs of the lower electrode 140 and the piezoelectric film 150 were approximately 3.36 and 2.54, respectively, and a value of the effective coupling coefficient Kt2_eff was approximately 2.13% (the second example of the present invention).

Accordingly, it can be appreciated that when the lower electrode 140 was formed of the first and the second electrode layers 141 and 142 and the first and the second electrode layers 141 and 142 are formed to have the predetermined thickness ratio to each other, the effective piezoelectric coupling coefficient Kt2_eff of the FBAR 100 can be easily adjusted over a wide range.

As described above, according to the exemplary embodiment of the present invention, the lower electrode 140 is configured, so that the first and the second electrode layers 141 and 142 are not only formed to have the grain sizes, that is, the surface roughnesses different from each other, respectively, but also to have the predetermined thickness ratio to each other. Accordingly, the effective piezoelectric coupling coefficient Kt2_eff of the FBAR 100 can be easily adjusted over a wide range.

The piezoelectric film 150 is disposed to cover upper surfaces of the insulating layer 120 and the lower electrode 140. The piezoelectric film 150, as a portion that causes a piezoelectric effect to convert electric energy to mechanical energy in the form of an elastic acoustic wave, is formed of AiN, ZnO, PZT (PbZrTiO), etc.

The upper electrode 160 is disposed on the piezoelectric film 150. Like the first and the second electrode layers 141 and 142 of the lower electrode 140, the upper electrode 160 is formed of a material with a superior conductivity, that is, Au, Ti, Ta, Mo, Ru, Pt, W, Al, or Ni.

The resonating unit 135 constructed as described above filters a radio signal of predetermined frequency using the piezoelectric effect of the piezoelectric film 150 described above. That is, the RF signals applied through the second electrode 160 are output toward the first electrode 140 via the resonating unit 135. At this time, since the resonating unit 135 has a predetermined resonance frequency according to oscillations generated from the piezoelectric film 150, only a signal corresponding to the predetermined resonance frequency of the resonating unit 135 among the applied RF signals is output.

As above, although the resonator according to the exemplary embodiment of the present invention is illustrated and explained as applied to the FBAR 100 having the air cavity 112, it will be applicable to any other apparatus using the piezoelectric film, for example, a Bragg reflector type FBAR having a reflective layer instead of the air cavity, in the same construction and the principle.

Hereinafter, a fabrication method of the FBAR 100 of FIG. 4 constructed as described above will be described in detail with reference to FIGS. 4 through 5G.

Figure 5A:
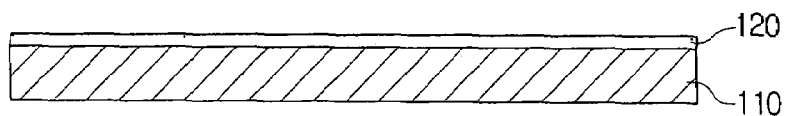
FIGS. 5A through 5G are cross sectional views illustrating a fabrication method of the resonator illustrated in FIG. 4.

First, as illustrated in FIG. 5A, an insulating layer 120, which is made up of $SiO_2$ or $Al_2O_3$, is deposited on an upper surface of the substrate 110.

Figure 5B:
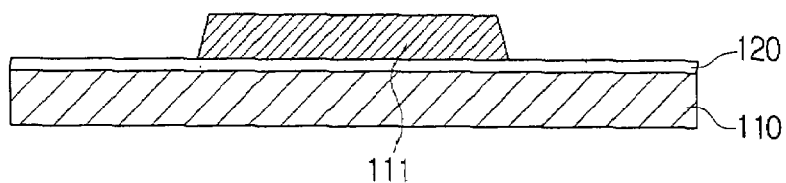

Subsequently, as illustrated in FIG. 5B, to form an air cavity sacrificing layer pattern 111, a sacrificing layer (not illustrated) is formed on the insulating layer 120. The sacrificing layer is made up of a material, such as a photoresist, which helps to form the following electrodes and the following piezoelectric film and which is easily etched, so that the air cavity sacrificing layer pattern 111 can be removed by an etching process later. The sacrificing layer is etched by using a sacrificing layer mask pattern (not illustrated) with a pattern of an air cavity 112, which is formed by a photolithography process, as a mask, and the sacrificing layer mask pattern is removed. As a result, the air cavity sacrificing layer pattern 111 is formed on the insulating layer 120 of the substrate 110. The air cavity sacrificing layer pattern 111 will be removed later to define an inner side shape of the air cavity 112.

Figure 5C:
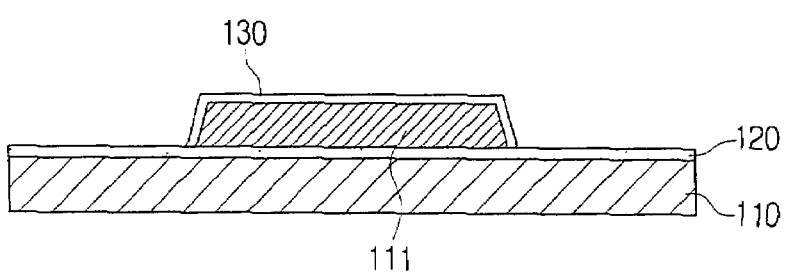

After that, as illustrated in FIG. 5C, a membrane 130 is formed over the substrate 110 over which the air cavity sacrificing layer pattern 111 is formed. The membrane 130 is made up of a silicon nitride or a silicon oxide, which is a flexible dielectric substance.

After the membrane 130 is formed, as illustrated in FIGS. 5D through 5G, a lower electrode 140, a piezoelectric film 150, and an upper electrode 160 are formed in turn on the membrane 130, so that a resonating unit 135 is formed.

Figure 5D:
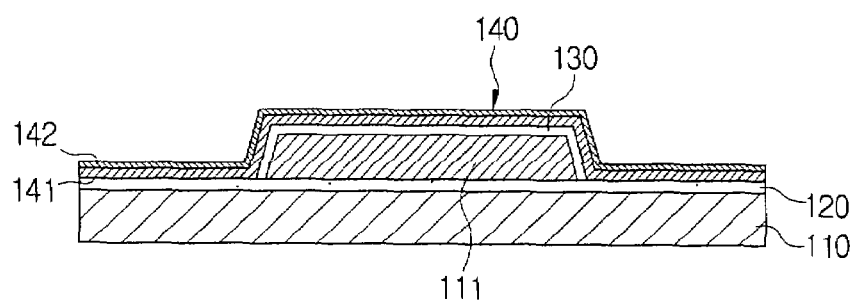

To be more specific, first, as illustrated in FIG. 5D, a first electrode layer 141 is deposited in a predetermined thickness, for example, approximately 3,000 Å (the first example of the present invention in the table 1) for obtaining an effective piezoelectric coupling coefficient Kt2_eff of approximately 4.0%, which is required in, for example, an US-PCS duplexer, on an entire upper surface of the membrane 130. The first electrode layer is made up of a material with a superior conductivity, such as Au, Ti, Ta, Mo, Ru, Pt, W, Al, or Ni. At this time, deposition conditions are adjusted, so that the first electrode layer is formed in a predetermined grain size, for example, a grain size with a surface roughness Ra of approximately 8.55.

Subsequently, a second electrode layer 142, which is made up of the same material as that of the first electrode layer, is deposited in a thickness of approximately 1,000 Å on the first electrode layer. At this time, deposition conditions are adjusted, so that the second electrode layer is formed in, for example, a grain size with a surface roughness Ra of approximately 13.64.

Figure 5E:
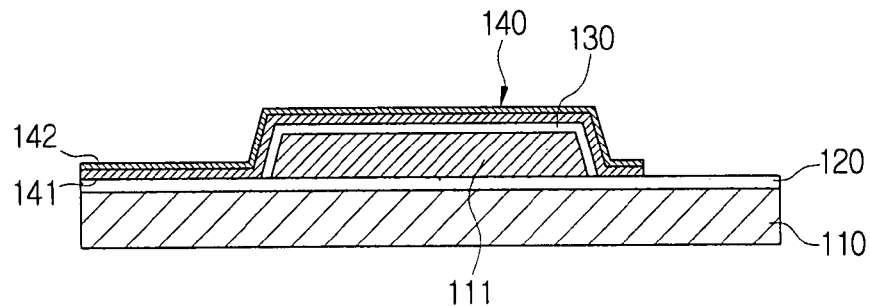

Next, the first and second electrode layers are patterned by using a laser trimming method, or etched by using a lower electrode pattern (not illustrated) with a pattern of the lower electrode 140, which is formed on the second electrode layer by a photolithography process, as a mask. As a result, as illustrated in FIG. 5E, the lower electrode 140 is formed, which exposes predetermined portions of the insulating layer 120 and the membrane 130.

Figure 5F:
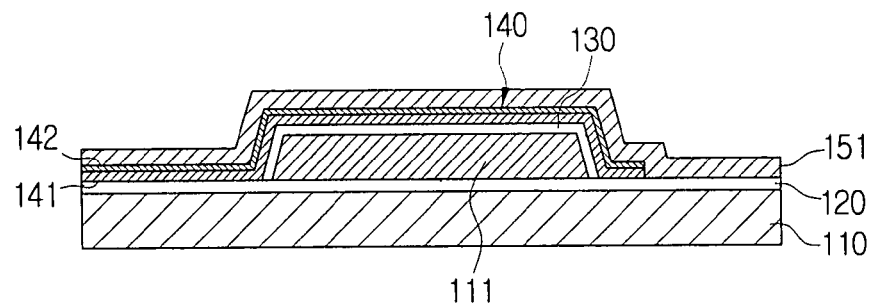
Figure 5G:
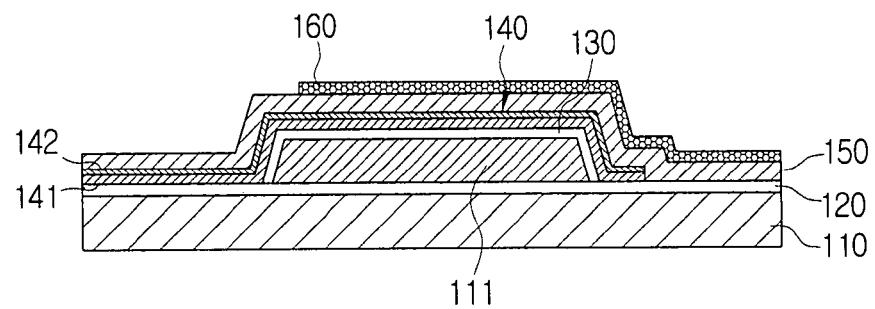

As illustrated in FIG. 5F, a piezoelectric layer 151 is then deposited in a predetermined thickness on an upper surface of the lower electrode 140 and the exposed upper surfaces of the insulating layer 120 and the membrane 130. The piezoelectric layer is made up of AiN, ZnO, or PZT.

After that, a third electrode layer (not illustrated), which is made up of the same material as that of the first and the second electrode layers 141 and 142, is deposited on an entire upper surface of the piezoelectric layer 151. Like the lower electrode 140, the third electrode layer is patterned by using the etching method or the laser trimming method. As a result, as illustrated in FIG. 5G, an upper electrode 160 is formed.

Next, like the lower electrode 140, the piezoelectric layer 151 is patterned by using the etching method or the laser trimming method. As a result, a piezoelectric film 150 is formed.

After the resonating unit 135 is formed as described above, to form the air cavity 112, the air cavity sacrificing pattern 111 is removed by an etching process of using $XeF_2$ gas, or a wet etching process of using a solvent having an etching selectivity with respect to the photoresist of the air cavity sacrificing pattern 111. At this time, the air cavity sacrificing pattern 111 can be removed through an etching passage (not illustrated) formed on the substrate 110. As a result, the air cavity 112 is formed over the substrate 110, and the fabrication process of the FBAR 100 is completed.

Figure 9:
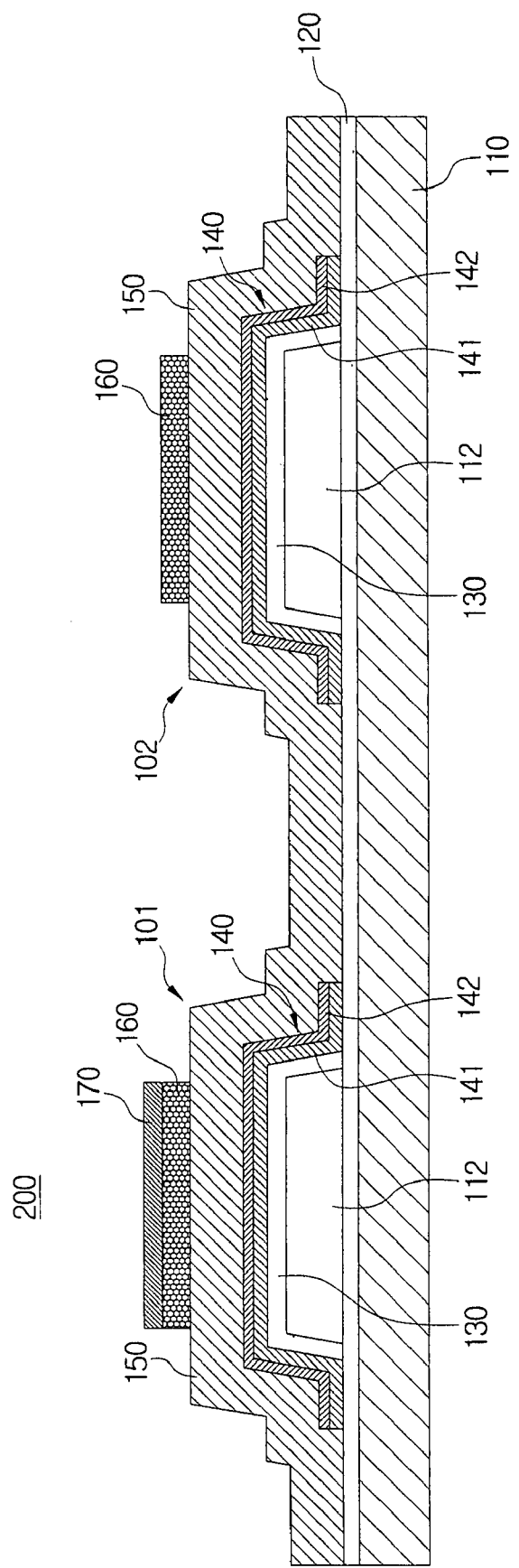
FIG. 9 is a cross sectional view illustrating an apparatus in which a plurality of FBARs, such as the FBAR illustrated in FIG. 4, are used.

FIG. 9 is a cross sectional view exemplifying an apparatus 200 in which a plurality of FBARs 101 and 102, such as the FBAR 100 constructed as described above, are used.

The apparatus 200 may be, for example, a part for electrode circuit, such as a band-pass filter in which a plurality of FBARs, each of which has a slightly different resonance frequency, are formed on a single wafer or substrate.

The apparatus 200 includes a substrate 110, a shunt FBAR 101, a series FBAR 102, and a frequency tuning layer 170.

The shunt FBAR 101 and the series FBAR 102 are made up of a first and a second lower electrodes 140, a first and a second piezoelectric films 150, and a first and a second upper electrodes 160, respectively. Since a construction of each of the shunt FBAR 101 and the series FBAR 102 is the same as that of the FBAR 100 explained with reference to FIGS. 4 through 5G, detailed description thereof will be omitted for clarity and conciseness.

The frequency tuning layer 170, which tunes a frequency using a principle that the frequency is in inverse proportion to a thickness of the FBAR, is formed on the first upper electrode 160 of the shunt resonator 101, so that the shunt resonator 101 has a resonance frequency slightly, for example, several percents, lower than that of the series resonator 102. The frequency tuning layer 170 can be formed of the same material as that of the lower and the upper electrodes 140 and 160, or a dielectric substance.

The apparatus 200 constructed as described above is configured, so that each of the first and the second lower electrodes 140 is formed of a first and a second electrode layers having grain sizes different from each other, respectively, and/or a predetermined thickness ratio to each other, as explained with reference to FIGS. 4 through 5G. Accordingly, effective piezoelectric coupling coefficients Kt2_eff of the series FBAR and the shunt FBAR 102 can be freely adjusted over a wide range, thereby allowing a roll-off characteristic to improve.

As apparent from the foregoing description, according to the exemplary embodiments of the present invention, the resonator, the apparatus having the same and the fabrication method of the resonator form the lower electrode out of the first and the second electrode layers having the grain sizes different from each other, respectively, and/or the predetermined thickness ratio to each other, so that the effective piezoelectric coupling coefficients Kt2_eff is adjusted to a value, which is required in a part of an electronic circuit, such as the filter, the duplexer, etc. Accordingly, the resonator, the apparatus having the same and the fabrication method of the resonator according to the exemplary embodiments of the present invention can freely adjust the effective piezoelectric coupling coefficient Kt2_eff by changing only the process conditions to form the first and the second electrode layers in the process equipment for forming the lower electrode without requiring a separate process or design. As a result, to adjust the effective piezoelectric coupling coefficient Kt2_eff, there is no need to change the constructions of the resonator except for the lower electrode as in the conventional resonator, thereby allowing a degree of freedom in design to improve. Also, the roll-off characteristic of a part of an electronic circuit, such as the filter, to which the resonator is applied, can be improved.

Although representative embodiments of the present invention have been shown and described in order to exemplify the principle of the present invention, the present invention is not limited to the specific embodiments. It will be understood that various modifications and changes can be made by one skilled in the art without departing from the spirit and scope of the invention as defined by the appended claims. Therefore, it shall be considered that such modifications, changes and equivalents thereof are all included within the scope of the present invention.

What is claimed is:

1. A resonator comprising:
   a substrate; and
   a resonating unit formed on the substrate and having a lower electrode, a piezoelectric film, and an upper electrode,
   wherein the lower electrode is formed of at least two layers to adjust a piezoelectric coupling coefficient,
   the lower electrode comprises a first electrode layer and a second electrode layer, which have crystallographic characteristics different from each other, respectively, and
   the first and the second electrode layers are formed to have grain sizes or surface roughnesses different from each other, respectively.

2. The resonator as claimed in claim 1, wherein the second electrode layer is formed over the first electrode layer, so that the grain size or the surface roughness thereof is larger than that of the first electrode layer.

3. The resonator as claimed in claim 1, wherein the first and the second electrode layers are formed to have a predetermined thickness ratio to each other.

4. The resonator as claimed in claim 3, wherein a total thickness of the lower electrode remains constant between variations of the predetermined thickness ratio.

5. The resonator as claimed in claim 1, wherein the first and the second electrode layers are formed of one selected out of Au, Ti, Ta, Mo, Ru, Pt, W, Al, and Ni.

6. A resonator comprising:
   a substrate; and
   a resonating unit formed on the substrate and having a lower electrode, a piezoelectric film, and an upper electrode,
   wherein the lower electrode is formed of at least two layers to adjust a piezoelectric coupling coefficient,
   the lower electrode comprises a first electrode layer and a second electrode layer, which have crystallographic characteristics different from each other, respectively, and
   the first and the second electrode layers are formed of the same material.

7. A fabrication method of a resonator comprising:
   forming a lower electrode on a substrate, the lower electrode comprising a first electrode layer and a second electrode layer, which have crystallographic characteristics different from each other, respectively; and
   forming a piezoelectric film and an upper electrode in turn on the lower electrode to form a resonating unit,
   wherein the first and the second electrode layers are formed to have grain sizes and surface roughnesses different from each other, respectively.

8. The fabrication method as claimed in claim 7, wherein the second electrode layer is formed over the first electrode layer, so that the grain size or the surface roughness thereof is larger than that of the first electrode layer.

9. The fabrication method as claimed in claim 7, wherein the first and the second electrode layers are formed to have a predetermined thickness ratio to each other.

10. The fabrication method as claimed in claim 9, wherein a total thickness of the lower electrode remains constant between variations of the predetermined thickness ratio.

11. The fabrication method as claimed in claim 7, wherein the first and the second electrode layers are formed of one selected out of Au, Ti, Ta, Mo, Ru, Pt, W, Al, and Ni.

12. A fabrication method of a resonator comprising:
    forming a lower electrode on a substrate, the lower electrode comprising a first electrode layer and a second electrode layer, which have crystallographic characteristics different from each other, respectively; and
    forming a piezoelectric film and an upper electrode in turn on the lower electrode to form a resonating unit,
    wherein the first and the second electrode layers are formed of the same material.

13. An apparatus comprising:
a substrate;
a first resonator formed on the substrate, and having a first lower electrode, a first piezoelectric film, and a first upper electrode, the first lower electrode being formed of at least two layers to adjust a piezoelectric coupling coefficient;
a second resonator formed on the substrate, and having a second lower electrode, a second piezoelectric film, and a second upper electrode, the second lower electrode being formed of at least two layers to adjust a piezoelectric coupling coefficient; and
a frequency tuning layer formed on one of the first and the second resonators, so that the one of the first and the second resonators has a resonance frequency lower than that of the other,
wherein each of the first and the second lower electrodes comprises a first electrode layer and a second electrode layer, which have crystallographic characteristics different from each other, respectively, and
the first and the second electrode layers are formed to have grain sizes and surface roughnesses different from each other, respectively.

14. The apparatus as claimed in claim 13, wherein the frequency tuning layer is formed on one of the first and second upper electrodes.

15. The apparatus as claimed in claim 13, wherein the second electrode layer is formed over the first electrode layer, so that the grain size or the surface roughness thereof is larger than that of the first electrode layer.

16. The apparatus as claimed in claim 13, wherein the first and the second electrode layers are formed to have a predetermined thickness ratio to each other.

17. The apparatus as claimed in claim 13, wherein the first and the second electrode layers are formed of one selected out of Au, Ti, Ta, Mo, Ru, Pt, W, Al, and Ni.

18. An apparatus comprising:
a substrate
a first resonator formed on the substrate, and having a first lower electrode, a first piezoelectric film, and a first upper electrode, the first lower electrode being formed of at least two layers to adjust a piezoelectric coupling coefficient;
a second resonator formed on the substrate, and having a second lower electrode, a second piezoelectric film, and a second upper electrode, the second lower electrode being formed of at least two layers to adjust a piezoelectric coupling coefficient; and
a frequency tuning layer formed on one of the first and the second resonators, so that the one of the first and the second resonators has a resonance frequency lower than that of the other,
wherein each of the first and the second lower electrodes comprises a first electrode layer and a second electrode layer, which have crystallographic characteristics different from each other, respectively, and the first and the second electrode layers are formed of the same material.

* * * * *